United States Patent [19]

Ohi et al.

[11] Patent Number: 5,001,350
[45] Date of Patent: Mar. 19, 1991

[54] ELECTRON MICROSCOPE

[75] Inventors: Kimio Ohi; Tohru Kasai, both of Tokyo, Japan

[73] Assignee: Jeol Ltd., Tokyo, Japan

[21] Appl. No.: 568,639

[22] Filed: Aug. 16, 1990

Related U.S. Application Data

[63] Continuation of Ser. No. 342,815, Apr. 25, 1989, abandoned.

[30] Foreign Application Priority Data

Apr. 28, 1988 [JP] Japan .................................. 63-107242

[51] Int. Cl.⁵ ............................................... G21K 5/08
[52] U.S. Cl. ........................ 250/440.100; 250/441.100; 250/442.100
[58] Field of Search ................ 250/440.1, 442.1, 441.1, 250/310, 311, 396 R, 396 ML

[56] References Cited

U.S. PATENT DOCUMENTS

| | | | |
|---|---|---|---|
| 3,679,900 | 7/1972 | Kimura | 250/441.1 |
| 3,745,341 | 7/1973 | Sakitani | 250/442.1 |
| 3,778,621 | 12/1973 | Mikajiri | 250/442.1 |
| 3,896,314 | 7/1975 | Nukui et al. | 250/442.1 |
| 4,020,353 | 4/1977 | Saito et al. | 250/441.1 |
| 4,405,865 | 9/1983 | Gentry et al. | 250/442.1 |
| 4,553,069 | 11/1985 | Purser | 250/442.1 |
| 4,705,950 | 11/1987 | Ohtaka | 250/442.1 |
| 4,710,633 | 12/1987 | Suzuki | 250/440.1 |
| 4,771,178 | 9/1988 | Egle et al. | 250/440.1 |

Primary Examiner—Jack I. Berman
Assistant Examiner—Kiet T. Nguyen
Attorney, Agent, or Firm—Fitzpatrick, Cella, Harper & Scinto

[57] ABSTRACT

An electron microscope equipped with a specimen positioning device for moving specimen holders within a place perpendicular to the optical axis of the electron beam between the upper and lower magnetic pole pieces of the objective lens and bringing the holders onto the optical axis. The microscope has a member extending through the side wall of the yoke of the objective lens, a preliminary chamber connected with the side wall of the yoke via a valve, and an exchange mechanism. The member can mount and dismount the specimen holders. The plural holders are placed in position within the chamber. The exchange mechanism can mount and dismount the specimen holder placed at a certain position within the chamber and can move this holder between the magnetic pole pieces of the objective lens from the chamber to the member or vice versa. Once the inside of the lens is evacuated to a high vacuum, a plurality of specimens can be observed successively.

9 Claims, 3 Drawing Sheets

ELECTRON MICROSCOPE

This application is a continuation of application Ser. No. 07/342,815 filed Apr. 25, 1989, now abandoned.

FIELD OF THE INVENTION

This invention relates to an electron microscope equipped with specimen positioning devices of the so-called side entry type for inserting specimens from directions perpendicular to the optical axis of the electron beam.

BACKGROUND OF THE INVENTION

Side-entry specimen positioning systems find extensive application in electron microscopy. Such specimen positioning systems are described in U.S. Pat. Nos. 3,745,341 and 3,778,621. FIG. 1(a) is a cross-sectional view of a conventional side-entry specimen positioning device. FIG. 1(b) is a cross-sectional view taken on line A—A' of FIG. 1(a). In these figures, an objective lens comprises a yoke 1, an excitation coil 2, an upper magnetic pole piece 3, and a lower magnetic pole piece. 4. The gap between the pole pieces 3 and 4 is maintained by a spacer 5. A stage 6 is installed in the yoke 1. A rotatable cylinder 7 is mounted to the stage 6 via a spacer 8 and a bearing 9. A specimen holder 11 extends through the cylinder 7. A specimen S is held to the front end of the holder 11 via a ball joint 10. A Z-axis adjusting screw 12 and a Y-axis adjusting screw 13 are mounted to the cylinder 7 to push that ball joint 10 in the Z and Y axes, respectively. Springs $S_1$ and $S_2$ are mounted between the cylinder 7 and the joint 10 and disposed opposite to the screws 12 and 13, respectively. The specimen holder 11 is capable of sliding inside the ball joint 10. The holder 11 is inserted between the pole pieces 3 and 4 from the X direction so as to cross the optical axis Z of the electron beam within the X-Y plane perpendicular to the optical axis Z. The specimen S can be rotated in the Z and Y directions about the ball joint 10 by rotating the Z-axis adjusting screw 12 and the Y-axis adjusting screw 13, respectively. Since the rotatable cylinder 7 is able to turn about the X axis perpendicular to the optical axis Z, the specimen S can be tilted to the optical axis Z by rotating the cylinder 7 in the direction indicated by the arrow C. The front end of the specimen holder 11 is retained by a pivot pin 14 and a pivot bearing 15. This bearing 15 is slidably fitted in a retainer 16 mounted to one side of the yoke 1. The bearing 15 is held by an X-axis adjusting screw 17 mounted to the retainer 16. The pivot pin 14 is supported by a spring (not shown) which is mounted to the pivot bearing 15. The specimen holder 11 can be moved in the X direction by rotating the X-axis adjusting screw 17.

It is well known that the resolution of an electron microscope is enhanced as the focal length of the objective lens is reduced. It is also well known that as the space between the upper pole piece 3 and the lower pole piece 4 is reduced, the focal length of the objective lens decreases, provided that the diameters of the pole pieces 3 and 4 of the objective lens are maintained constant. In the aforementioned specimen positioning device of the electron microscope, the front end of the specimen holder 11 is retained by the pivot pin 14 and the pivot bearing 15 and, therefore, the bearing 15 and the pin 14 are pressed against the front end of the holder 11 when the X-axis adjusting screw 17 is rotated. Further, the atmospheric pressure acts on the specimen holder 11, because the inside of the yoke 1 is a vacuum. For this reasons, the front end of the holder is pressed against the pivot pin 14 with a greater force. In addition, a moment due to the weight of the pin 14 itself acts on the front end of the holder. In this way, a plurality of forces act on the front end of the specimen holder 11. Therefore, if the portion of the holder 11 which holds the specimen is thinned, then the specimen S bends. Accordingly, the front end of the specimen holder which grips the specimen must be thickened. Consequently, the space between the pole pieces 3 and 4 of the objective lens must be increased.

In recent years, a specimen positioning device which is free of the foregoing problems has been proposed. FIG. 2(a) is a cross-sectional view of this device. FIG. 2(b) is a cross-sectional view taken on line B—B' of FIG. 2(a). In these figures, an objective lens comprises a yoke 21, an excitation coil 22, an upper magnetic pole piece 23, and a lower magnetic pole piece 24. The gap between the pole pieces 23 and 24 are maintained by a spacer 25. A stage 26 is installed in the yoke 21. A rotatable cylinder 27 is mounted to the stage 26 via a spacer 28 and a bearing 29. A specimen holder 31 extends through the cylinder 27. A specimen S is held to the front end of the holder 31 via a ball joint 30. A Z-axis adjusting screw 32 and Y-axis adjusting screw 33 are mounted to the cylinder 27 to push the joint 10 in the Z and Y directions, respectively. Springs $S_1$ and $S_2$ are mounted between the cylinder 27 and the ball joint 30 and located opposite to the adjusting screws 32 and 33, respectively. A tapering insulator 34 is fixed to the outer periphery of the specimen holder 31 and protrudes from the front end of the cylinder 27 toward the optical axis Z of the electron beam. A spherical member 35 is fixed to the outer periphery of the insulator 34. A support 36 is fitted in the side wall of the yoke 21 perpendicularly to the X axis. An arm 37 is mounted inside the support 36 in such a way that the arm can be rotated about a pin 38 by rotating an X-axis adjusting screw 39. The front end cf the arm 37 is provided with a round hole through which the specimen holder 31 extends. Two bushings 40 and 41 are mounted around the hole. One of the bushings is located above the plane defined by the X axis and the optical axis, while the other is located below the plane. The central axis of the bushings 40 and 41 agrees with the central axis of the spherical member 35. The bushings 40 and 41 are fixed to the arm 37 such that they are in contact with the spherical member 35. A pivot bearing 42 is mounted between the arm 37 and the X-axis adjusting screw 39. A spring 43 is mounted between the arm 37 and the support 36.

In this specimen positioning device, the inside of the yoke 1 is a vacuum and so the atmospheric pressure acts on the specimen holder 31. This pressure is transmitted to the bushings 40 and 41 via the spherical member 35. When the arm 37 is rotated by rotating the x-axis adjusting screw 39, the bushings 40 and 41 are rotated about the pin 38. At this time, the spherical member 35 slides on the bushings 40 and 41. Then, the specimen holder 31, or the specimen S, is moved in the X direction by the sliding movement of the spherical member 35. The holder 31 can be rotated about the ball joint 31 in the Z and Y directions by rotating the Z- and Y-axis adjusting screws 32 and 33, respectively. Since the atmospheric pressure causes the spherical member 35 to press the specimen holder 31 against the bushings 40 and 41 and all times, the holder 31 rotates while sliding in the ball joint 30. Thus, the spherical member 35 rotates while sliding on the bushings. The specimen S moves in the Y or Z direction. Since the rotatable cylinder 27 can rotate about the X axis perpendicular to the optical axis Z of the electron beam, when the cylinder 27 is rotated in the direction indicated by the arrow C, the holder 31 turns about the X axis. Simultaneously, the spherical member 35 slides on the bushings 40 and 41. Consequently, the specimen S can be inclined to the optical axis Z.

In this manner, in the specimen positioning device shown in FIGS. 2(a) and 2(b), neither the atmospheric pressure nor the moment arising from the weight of the pivot pin itself is applied to the front end of the specimen holder 31 which grips the specimen and, therefore, the front end can be made thin. This enables the gap between the pole pieces 3 and 4 to be narrowed. Hence, the resolution of the electron microscope can be enhanced.

In this specimen positioning device of the electron microscope, after the specimen holder holding plural specimens is placed in position within the objective lens, the inside of the lens is evacuated to a high vacuum. Then, the specimens held by the holder are successively observed. If new specimens are to be observed, the inside of the objective lens is once returned to the atmospheric pressure. Subsequently, the new specimen holder is set in the lens. The inside of the lens is evacuated to a high vacuum. Thereafter, the specimens held by the holder are observed one after another. In this way, specimens which can be observed after the inside has been once evacuated are few in number, and it takes a long time to evacuate the inside to a high vacuum. Consequently, it is impossible to observe a number of specimens in a short time.

Where specimens are heated, cooled, subjected to an evaporation process, or otherwise processed before placed in position within the objective lens, a chamber is formed for the processing. However, in the specimen positioning device shown in FIGS. 2(a) and 2(b), the chamber for the processing must be located inside the specimen holder 31 which is opposite to the optical axis. Therefore, the holder 31 is long and susceptible to external vibration. This also hinders the observation of specimens.

SUMMARY OF THE INVENTION

It is an object of the invention to provide a specimen positioning device which permits one to observe a number of specimens in a short time.

It is another object of the invention to provide a specimen positioning device equipped with specimen holders which are insusceptible to external vibration.

An electron microscope according to the invention is equipped with a specimen positioning device which moves specimen holders within a plane perpendicular to the optical axis of the electron beam between the upper and lower magnetic pole pieces of the objective lens and brings the holders onto the optical axis. The microscope comprises a fixing means extending through the side wall of the yoke of the objective lens, a preliminary chamber connected to the side wall of the yoke via a valve, and an exchange means. A plurality of specimen holders are placed in position within the chamber. The fixing means can mount and dismount the specimen holders. The exchange means can mount and dismount the specimen holder which is brought into a certain position within the preliminary chamber. The exchange means can carry this holder from the chamber to the fixing means or vice versa between the upper and lower magnetic pole pieces of the objective lens.

DESCRIPTION OF THE PREFERRED EMBODIMENTS

Figure 3:
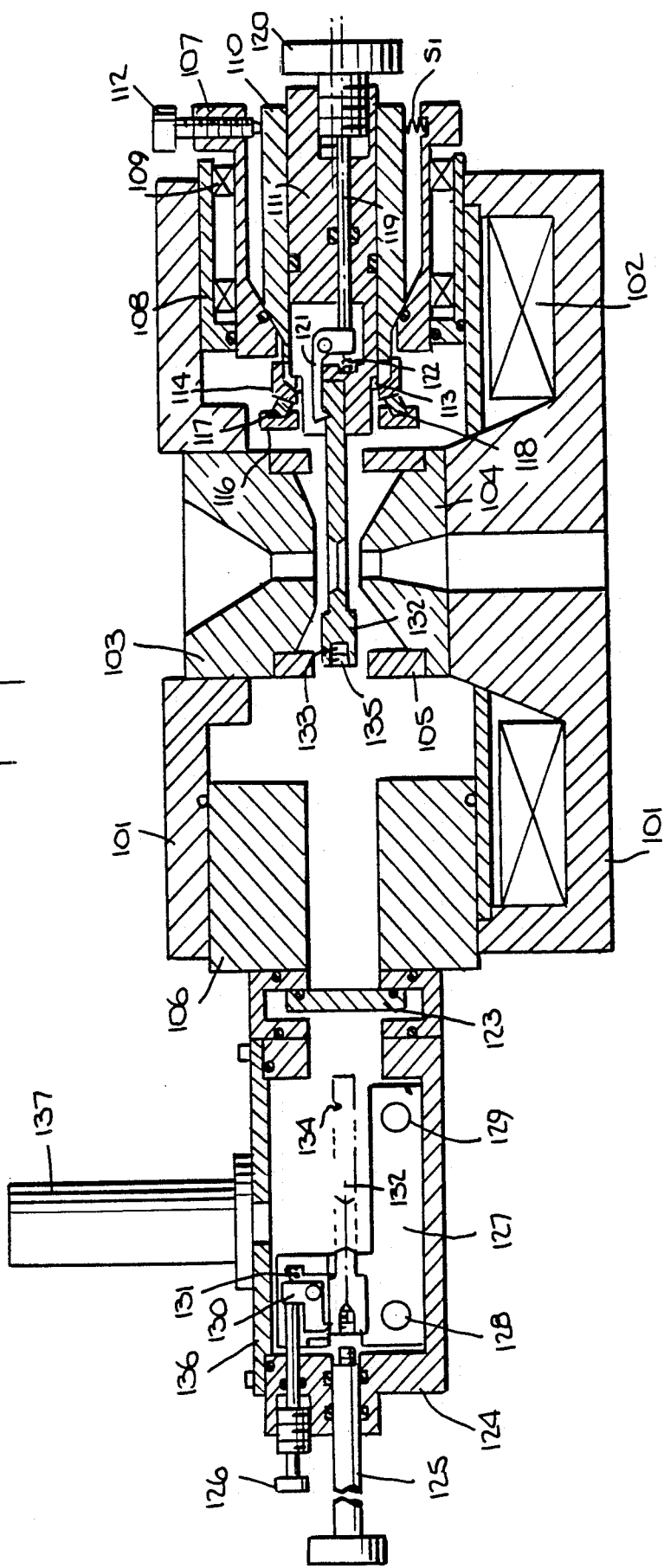
FIG. 3 is a cross-sectional view of a side-entry specimen positioning device for use in an electron microscope according to an embodiment of the invention.

Referring to FIG. 3, there is shown a side-entry specimen positioning device for use in an electron microscope according to an embodiment of the invention. The objective lens of the microscope comprises a yoke 101, an excitation coil 102, an upper magnetic pole piece 103, and a lower magnetic pole piece 104. The gap between the pole pieces 103 and 104 is maintained by a spacer 105. Installed inside the yoke 101 is a stage 106 to which a rotatable cylinder 107 is mounted via a spacer 108 and a bearing 109. A ball joint 110 is mounted inside the cylinder 107. A fixing member 111 extends through the joint 110. A Z-axis adjusting screw 112 and a Y-axis adjusting screw (not shown) are mounted to the cylinder 107 to push the joint 110 in the Z and Y directions, respectively. A spring $S_1$ and a similar spring (not shown) are mounted between the cylinder 107 and the joint 110 and located opposite to the adjusting screws, respectively.

Figure 1A:
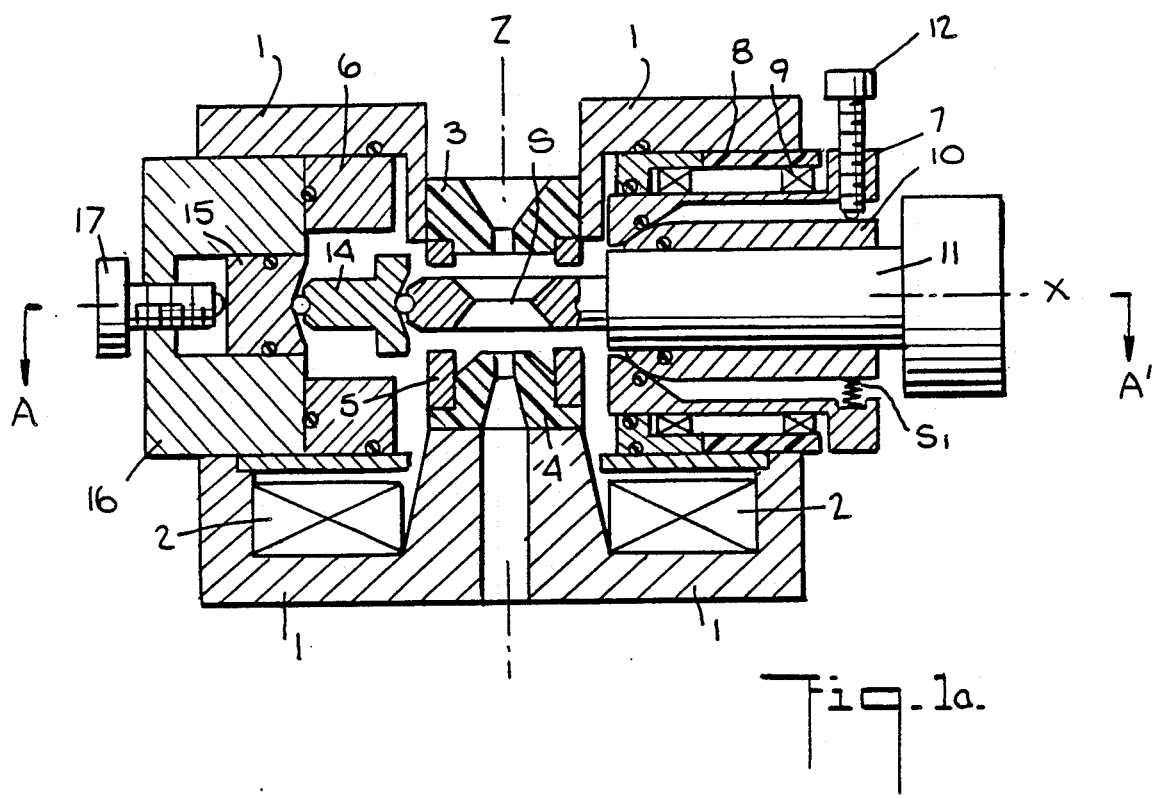
FIG. 1(a) is a cross-sectional view of a conventional side-entry specimen positioning device for use in an electron microscope.
Figure 1B:
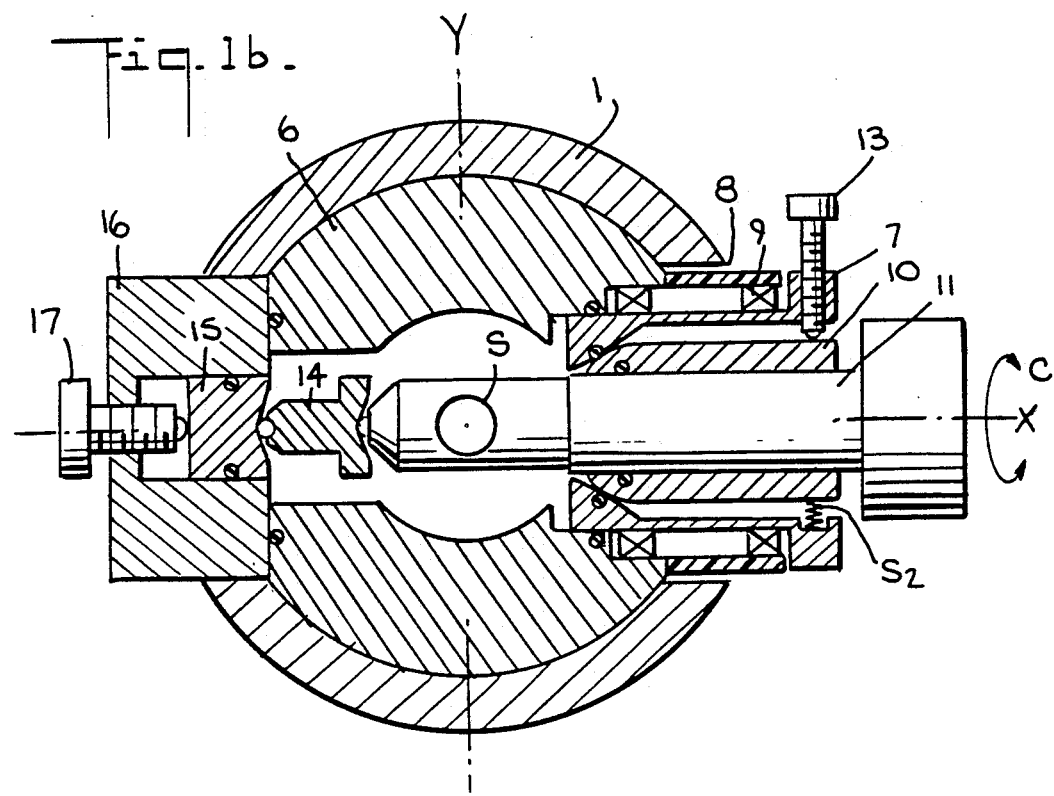
FIG. 1(b) is a cross-sectional view taken on line A—A' of FIG. 1(a)
Figure 2A:
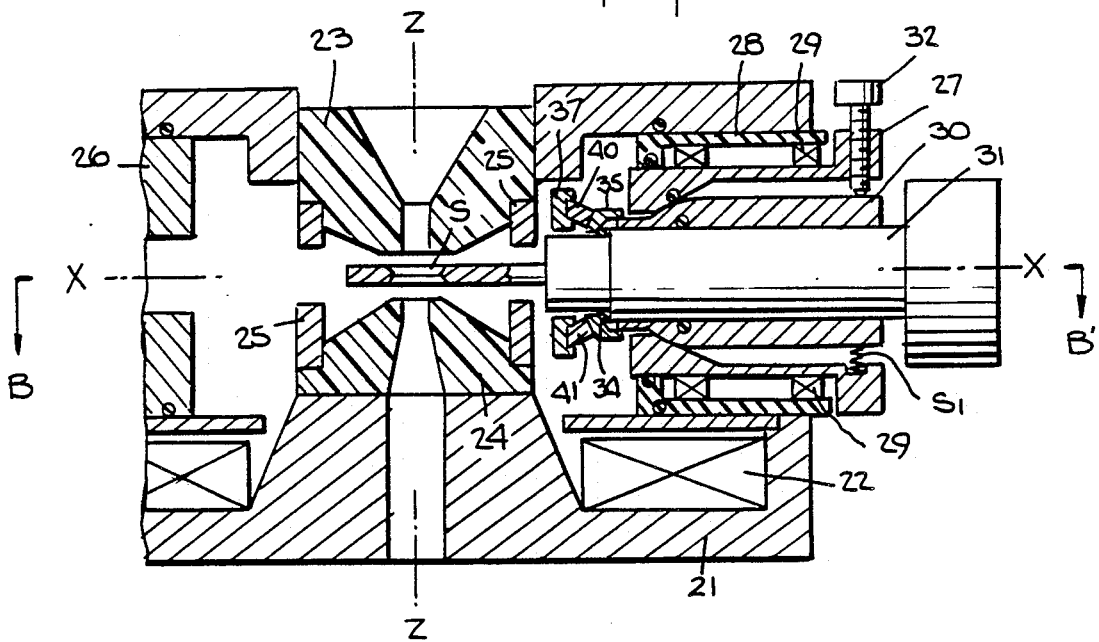
FIG. 2(a) is a cross-sectional view of a conventional specimen positioning device.
Figure 2B:
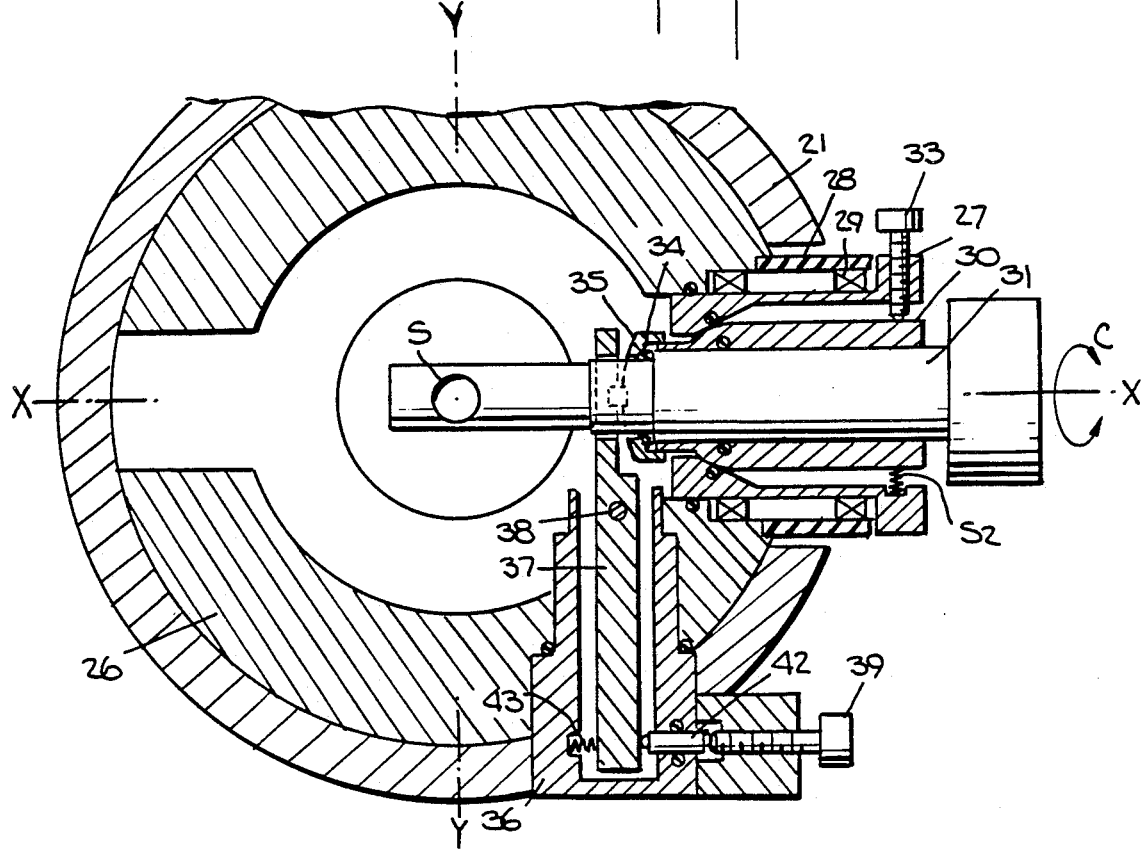
FIG. 2(b) is a cross-sectional view taken on line B—B' of FIG. 2(a)

The specimen positioning device includes a mechanism for moving specimens along the X axis. This mechanism shown in FIG. 3 is similar to the mechanism shown in FIGS. 2(a) and 2(b) except that the specimen holder 31 shown in FIGS. 2(a) and 2(b) is replaced by the fixing member 111. To avoid repeated description, therefore, only a tapering insulator 113 mounted to the outer periphery of the fixing member 111, a spherical member 114, an arm 116 rotated by rotating an X-axis adjusting screw (not shown), bushings 117, 118 fixed to the arm 116 are shown.

A screw 120 having a rod 119 and a lever 121 having a claw are mounted in the fixing member 111. Since the lever 121 is connected with the fixing member 111 by a spring 122, the lever 121 is kept in contact with the rod 119.

A preliminary chamber 124 is fixed by a valve 123 on the opposite side of the stage 106 from the optical axis Z of the electron beam. A specimen exchange rod 125 and a screw 126 are mounted to the side surface of the chamber. 124 which is opposite to the optical axis Z. A support 127 is mounted inside the chamber 124 and held by rails 128 and 129. The support 127 moves on the rails 128 and 129 when an external force is applied to it. Levers 130 each having a claw and springs 131 are mounted on the support 127 such that they are regularly spaced from each other in the direction of movement of the support.

The novel specimen holders 132 entirely differ from the prior art specimen holder as described now. Each holder has V grooves 133 and 134 at opposite ends. An internal thread 135 is formed at open side of each holder. The holders $132_1, 132_2, \ldots, 132_n, \ldots$ are so placed on the support 127 that the levers $130_1, 130_2, \ldots, 130_n, \ldots$ are received in their respective V grooves $133_1, 133_2, \ldots, 133n, \ldots$. Whenever the support moves a given distance, one specimen holder reaches a certain location where it is replaced. In this position, the front end of the specimen exchange rod 125 is screwed into the internal thread 135 of the holder. At the same time, the screw 126 is rotated so that the lever 130 may be pushed by the front end of the screw. As a result, the claw of the lever 130 comes out of the V groove 133 in the specimen holder 132. A cover 136 is mounted in the chamber 124 to permit insertion and withdrawal of the holder. A processing device 137 for heating or cooling the specimen, depositing a metal vapor onto it, or otherwise processing it is mounted in the center of the cover.

In the operation of the specimen positioning device constructed as described thus far, the cover 136 of the preliminary chamber 124 is removed. The specimen holders 132 each holding plural specimens are placed on the support 127. After closing the cover 136, the inside of the chamber 124 is evacuated to a high vacuum. Then, the support 127 is moved a given distance to bring some specimen holder into the exchange position. In this location, the front end of the specimen exchange rod 125 is screwed into the internal thread 135 of the holder. At the same time, the screw 126 is rotated to press the front end of the screw against the lever 130. Then, the claw of the lever 130 comes out of the V groove 133 in the specimen holder 132. If the specimen held by the holder 130 should be processed e.g., it is heated, cooled, or a metal vapor is deposited onto it, then the processing operation is performed by the processing device 137 Subsequently, the screw 120 in the fixing member 111 is rotated to raise the claw of the lever 121. Concurrently, the valve 123 is opened. Then, the specimen exchange rod 125 is pushed carefully until the specimen holder 132 passes across the gap between the upper magnetic pole piece 103 and the lower magnetic pole piece 104 of the objective lens and reaches the fixing member 111. The screw 120 is turned to lower the lever 121, so that the claw of the lever 121 enters the V groove 134 in the holder 132. At this time, the exchange rod 125 is rotated to move to rod away from the holder 132.

When the specimen holders should be replaced, the sequence of operations is carried out in the reverse order to the foregoing, for bringing the used holders back onto the support 127. Then, the sequence of operations is performed in the same order as the foregoing to place new specimen holders in the objective lens.

In the above example, the specimen exchange rod is joined to the specimen holder by screwing the rod into the holder. The rod may also be joined to the holder by gripping, the holder with the rod. Further, a block equipped with a shaft, an electrode rod, and a cooling rod may be mounted inside the fixing member 111. Specifically, when the specimen holder 132 is connected with the block, the shaft enables the human operator to externally rotate or tilt the specimen S. The electrode rod can heat the specimen. The cooling rod can cool the specimen.

As described above, in accordance with the present invention, a preliminary chamber in which numerous specimen holders each holding plural specimens can be placed in position is provided. Therefore, once the inside of the objective lens is evacuated to a high vacuum, a multiplicity of specimens can be observed Consequently, many specimens can be observed in a short time.

Also, the invention allows a processing device for heating specimens, cooling them, depositing a metal vapor onto them or otherwise treating them to be mounted in the preliminary chamber before the specimens are placed on position within the objective lens. Additionally, the specimen holders themselves are short. Consequently, the holders placed in the lens are insusceptible to external vibration. Hence, the specimens can be observed without hindrance.

The terms "electron microscope", "specimen positioning devices","yoke", "excitation coil", "magnetic pole piece", "spacer", "specimen holder", "ball joint", "bushing", "bearing", "objective lens", "valve", "fixing member", "insulator", "claw" and other terms identifying features of the disclosed invention are each used generically; that is, the functional requirements that must be met by each of the elements identified by these terms will be apparent to one of ordinary skill in the art, and those terms accordingly are used throughout the specification and the claims to designate any element which meets such requirements.

The present invention is not limited to the details of the foregoing embodiments but includes various modifications within the scope and spirit of the appended claims.

What is claimed:

1. An electron microscope for observing a specimen mounted in a specimen holder inserted into a gap between an upper pole piece and a lower pole piece of an objective lens in a housing including a yoke having a side wall, said electron microscope comprising:

at least one specimen holder for holding each specimen;

a specimen positioning device extending through a first side of the side wall of the yoke, said positioning device being adapted for positioning said specimen holder;

a valve;

a preliminary chamber communicating with a second side of the side wall of the yoke by said valve;

an exchange means having an exchanging rod extending from said preliminary chamber adapted for transporting one of the specimen holders from said preliminary chamber through the gap to said positioning device; and a fixing means adopted for mounting and dismounting the specimen holder exchanged by said exchange means to said specimen positioning device.

2. The electron microscope according to claim 1, wherein said preliminary chamber comprises a processing device for processing the specimen having a process selected from the group consisting of heating the specimen, cooling the specimen and depositing a metal vapor onto the specimen.

3. The electron microscope according to claim 1, wherein a specimen shift mechanism is mounted on the same side as the fixing means.

4. The electron microscope according to claim 1, wherein each of the specimen holders comprises a first groove at one end thereof and a second groove at the other and thereof, wherein said exchange means comprises a first claw and said fixing means comprises a second claw, wherein said first claw communicates with said first groove when that one specimen holder is being exchanged by said exchanging means, and wherein said second claw communicates with said second groove when that one specimen holder is mounted in said fixing means.

5. The electron microscope according to claim 4, wherein each of the specimen holders further comprises an internal thread and said exchange means further comprises screw-threaded portion and wherein said screw-threaded portion communicates with said internal thread when that one specimen holder is being exchanged by said exchanging means.

6. The electron microscope according to claim 1, wherein said preliminary chamber comprises a support and a plurality of rails, wherein said support is moved along said plurality of rails, and wherein the specimen holders are disposed on said support prior to being exchanged by said exchanging means.

7. An electron microscope for observing a specimen mounted in a specimen holder inserted into a gap between an upper pole piece and a lower pole piece of an objective lens in a housing including a yoke having a side wall, said electron microscope comprising:
- at least one specimen holder for holding each specimen;
- a specimen positioning device extending through a first side of the side wall of the yoke, said positioning device being adapted for positioning said specimen holder;
- a valve;
- a preliminary chamber communicating with a second side of the side wall of the yoke by said valve, wherein said preliminary chamber comprises a support and a plurality of rails, wherein said support is moved along said rails, and wherein the specimen holders are disposed on said support;
- an exchange means having an exchanging rod extending from said preliminary chamber adapted for transporting one of the specimen holders from said preliminary chamber through the gap to said positioning device; and
- a fixing means adopted for mounting and dismounting the one specimen holder exchanged by said exchanged means to said specimen positioning device.

8. An electron microscope for observing a specimen mounted in a specimen holder inserted into a gap between an upper pole piece and a lower pole piece of an objective lens in a housing including a yoke having a side wall, said electron microscope comprising:
- at least one specimen holder for holding each specimen;
- a specimen positioning device extending through a first side of the side wall of the yoke, said positioning device being adapted for positioning said specimen holder;
- a valve;
- a preliminary chamber communicating with a second side of the side wall of the yoke by said valve, and which houses a plurality of specimen holders, wherein said preliminary chamber comprises a support and a plurality of rails, wherein said support is moved along said rails, wherein the specimen holders are disposed on said support, and wherein each of said specimen holders comprises a first groove at one end thereof and a second groove at the other end thereof;
- an exchange means having an exchanging rod extending from said preliminary chamber adapted for transporting one of the specimen holders from said preliminary chamber through the gap to said positioning device wherein said exchange means comprises a first claw for communicating with said first groove when that one specimen holder is being exchanged by said exchanging means; and
- a fixing means adopted for mounting and dismounting the one specimen holder to said specimen positioning device, wherein said fixing means comprises a second claw for communicating with said second groove when that one specimen holder is mounted in said fixing means.

9. A specimen positioning device for an electron microscope having a yoke, a preliminary chamber communicating with a first side of a side wall, and at least two specimen holders, one of the specimen holders being inserted into a gap between an upper pole piece and a lower pole piece of an objective lens extending through a second side of the side wall of the yoke, said positioning device comprising:
- an exchange means having an exchanging rod extending from said preliminary chamber adapted for transporting the one of the specimen holders from the preliminary chamber through the gap to said positioning device, wherein each of the specimen holders comprises a first groove at one end thereof and a second groove at the other end thereof and wherein said exchange means comprises a first claw for communicating with said first groove when that one specimen holder is being exchanged by said exchanging means; and
- a fixing means extending through a side wall of the yoke adapted for mounting and dismounting the exchanged specimen holder with said exchange means and said fixing means comprises a second claw for communicating with said second groove when the specimen holder is mounted in said fixing means.

* * * * *